US012696423B2

(12) United States Patent
Yang et al.

(10) Patent No.: US 12,696,423 B2
(45) Date of Patent: Jul. 28, 2026

(54) VAPOR CHAMBER AND ELECTRONIC DEVICE

(71) Applicant: HUAWEI TECHNOLOGIES CO., LTD., Shenzhen (CN)

(72) Inventors: Jie Yang, Dongguan (CN); Jian Shi, Shanghai (CN); Yongfu Sun, Shenzhen (CN); Zhen Sun, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 204 days.

(21) Appl. No.: 18/073,307

(22) Filed: Dec. 1, 2022

(65) Prior Publication Data

US 2023/0107867 A1 Apr. 6, 2023

Related U.S. Application Data

(63) Continuation of application No. PCT/CN2021/096985, filed on May 28, 2021.

(30) Foreign Application Priority Data

Jun. 1, 2020 (CN) .......................... 202010485885.4

(51) Int. Cl.
*H05K 7/20* (2006.01)
*G06F 1/20* (2006.01)

(52) U.S. Cl.
CPC ..... *H05K 7/20309* (2013.01); *H05K 7/20336* (2013.01); *G06F 1/203* (2013.01)

(58) Field of Classification Search
CPC .......... H05K 7/20309; H05K 7/20336; H05K 7/20509; H05K 7/20472; G06F 1/203;
(Continued)

(56) References Cited

U.S. PATENT DOCUMENTS 3,587,725 A * 6/1971 Basiulis ................ F28D 15/046
165/104.26
3,754,594 A * 8/1973 Ferrell .................. F28D 15/046
165/272
(Continued)

FOREIGN PATENT DOCUMENTS

CN 101995183 A 3/2011
CN 202142519 U 2/2012
(Continued)

OTHER PUBLICATIONS

"Wick." Merriam-Webster.com Dictionary, Merriam-Webster, https://www.merriam-webster.com/dictionary/wick. Accessed Apr. 15, 2025. (Year: 2025).*

*Primary Examiner* — Jayprakash N Gandhi
(74) *Attorney, Agent, or Firm* — Leydig, Voit & Mayer, Ltd.

(57) ABSTRACT

A vapor chamber is provided. The vapor chamber includes a first cover close to a heat source, and a second cover far from the heat source. The first cover and the second cover form a cavity, the cavity is divided into at least a first cavity and a second cavity, and the first cavity and the second cavity have different cross-sectional sizes. A first wick is disposed in the first cavity, and the first wick has one end connected to the first cover and the other end connected to the second cover. A second wick is disposed in the second cavity, and the second wick is parallel to the first cover. The first wick is connected to the second wick, and the first cavity communicates with the second cavity.

25 Claims, 6 Drawing Sheets

(58) Field of Classification Search
CPC ........ G06F 1/20; F28D 15/046; F28D 15/043;
F28D 15/0266; F28D 15/04; F28D
15/0233; H01L 23/427; F28F 3/12
See application file for complete search history.

(56) References Cited

U.S. PATENT DOCUMENTS

| | | | | |
|---|---|---|---|---|
| 7,891,413 B2* | 2/2011 | Liu | .................. | F28D 15/046 |
| | | | | 29/890.032 |
| 2002/0062648 A1* | 5/2002 | Ghoshal | ............. | F28D 15/0233 |
| | | | | 165/104.33 |
| 2009/0025910 A1 | 1/2009 | Hoffman et al. | | |
| 2009/0040726 A1* | 2/2009 | Hoffman | ............. | F28D 15/0233 |
| | | | | 29/890.032 |
| 2010/0307003 A1* | 12/2010 | Hoffman | ............. | F28D 15/046 |
| | | | | 29/890.032 |
| 2012/0247736 A1* | 10/2012 | Xiang | ................ | F28D 15/0266 |
| | | | | 165/104.26 |
| 2015/0041103 A1* | 2/2015 | Kiley | ................. | F28D 15/0233 |
| | | | | 165/104.26 |
| 2015/0055300 A1* | 2/2015 | Hsieh | ................. | G06F 1/20 |
| | | | | 165/104.26 |
| 2017/0363367 A1* | 12/2017 | Yeh | ................. | F28D 15/0266 |
| 2018/0356156 A1 | 12/2018 | Hurbi et al. | | |
| 2019/0113290 A1* | 4/2019 | Tseng | ................ | F28D 15/046 |
| 2020/0003499 A1* | 1/2020 | Kume | ................. | F28D 15/046 |
| 2020/0003501 A1 | 1/2020 | Wakaoka | | |
| 2020/0200486 A1* | 6/2020 | Cheng | .................. | F28D 15/046 |
| 2021/0095930 A1* | 4/2021 | Inagaki | ............... | F28D 15/0233 |
| 2021/0136955 A1* | 5/2021 | Wakaoka | ............. | F28D 15/046 |

FOREIGN PATENT DOCUMENTS

| | | |
|---|---|---|
| CN | 106376214 A | 2/2017 |
| CN | 107003076 A | 8/2017 |
| CN | 107231780 A | 10/2017 |
| CN | 109253641 A | 1/2019 |
| CN | 209281334 U | 8/2019 |
| CN | 213343091 U | 6/2021 |
| JP | 2015059693 A | 3/2015 |
| JP | 2015088882 A | 5/2015 |
| JP | 2015121355 A | 7/2015 |
| JP | 2016050682 A | 4/2016 |
| JP | 2016205693 A | 12/2016 |
| JP | 2017044356 A | 3/2017 |
| JP | 2018115813 A | 7/2018 |
| JP | 2018128208 A | 8/2018 |
| JP | 2018162949 A | 10/2018 |
| JP | 2018179388 A | 11/2018 |
| JP | 2018197631 A | 12/2018 |
| JP | 2019039662 A | 3/2019 |
| TW | 201610384 A | 3/2016 |
| TW | 201842296 A | 12/2018 |
| TW | 201903347 A | 1/2019 |
| TW | 201904374 A | 1/2019 |
| WO | 2018116951 A1 | 6/2018 |

* cited by examiner

C-C

D-D

VAPOR CHAMBER AND ELECTRONIC DEVICE

CROSS-REFERENCE TO RELATED APPLICATIONS

This application is a continuation of International Application No. PCT/CN2021/096985, filed on May 28, 2021, which claims priority to Chinese Patent Application No. 202010485885.4, filed on Jun. 1, 2020. The disclosures of the aforementioned applications are hereby incorporated by reference in their entireties.

TECHNICAL FIELD

Embodiments of this application relate to the field of electronic devices, and in particular, to a vapor chamber and an electronic device.

BACKGROUND

An electronic product, such as a mobile phone, a tablet computer, or a notebook, generates heat when working. If the heat is not dissipated in time but accumulated inside the electronic product, a temperature of the electronic product is increased, thereby affecting performance and user experience of the electronic product, or seriously, the electronic product is faulty and damaged. Therefore, various heat dissipation solutions for electronic products are continuously developed in the industry to resolve a heat dissipation problem of the electronic products.

Currently, a vapor chamber (VC) is used to dissipate heat on electronic products. The vapor chamber is a vacuum cavity with a fine structure on an inner wall and injected with a working medium. As shown in FIG. 1, a current vapor chamber includes: a first cover 101, a wick 104, and a second cover 102. The wick 104 is parallel to the first cover 101, and the second wick 104 covers the first cover 101. A cavity between the wick 104 and the second cover 102 is a vapor cavity, and the wick 104 and the vapor cavity are a serial structure.

However, the vapor chamber generally requires a support structure disposed between the wick and the second cover. As a result, a product thickness is relatively high, and with a trend of continuously reducing the thickness, production costs are increasingly high, and thermal performance is bottlenecked.

SUMMARY

Embodiments of this application provide a vapor chamber and an electronic device, to resolve problems of high costs and an undiversified structure of a vapor chamber.

To achieve the foregoing objective, the following technical solutions are used in this application. According to a first aspect of this application, a vapor chamber is provided, including a first cover close to a heat source, and a second cover far from the heat source. The first cover and the second cover form a cavity, the cavity is divided into at least a first cavity and a second cavity, and the first cavity and the second cavity have different cross-sectional sizes. A first wick is disposed in the first cavity, and the first wick has one end connected to the first cover and the other end connected to the second cover. A second wick is disposed in the second cavity, and the second wick is parallel to the first cover. The first wick is connected to the second wick, and the first cavity communicates with the second cavity. Therefore, the vapor chamber can be divided into at least two parts, a wick in a part of the vapor chamber uses a serial structure, and a wick in a part of the vapor chamber uses a parallel structure. In this embodiment of this application, a vapor chamber combining a serial structure and a parallel structure is used, which can support an irregular structure, so that an internal structure of the wick can be flexibly adjusted based on a shape of a heat source of a product, thereby improving temperature equalizing performance of the vapor chamber. In addition, a cross-sectional height of the vapor chamber with a parallel structure is lower, which helps product miniaturization.

In an optional implementation, the first cavity and the second cavity have different cross-sectional heights. Therefore, a cross-sectional height of a part that is of the vapor chamber and that is close to the heat source can be increased, to improve temperature equalizing performance of the vapor chamber at a position close to the heat source.

In an optional implementation, the first cavity and the second cavity have different cross-sectional widths. Therefore, a cross-sectional width of a part that is of the vapor chamber and that is close to the heat source can be increased, to improve temperature equalizing performance of the vapor chamber at a position close to the heat source.

In an optional implementation, there are a plurality of first wicks, and the plurality of first wicks are disposed in parallel. Therefore, the first wicks can divide the first cavity into a plurality of vapor cavities, and the first wicks and the vapor cavities are a parallel structure, thereby improving heat transfer performance of the vapor chamber, and reducing a cross-sectional height of the vapor chamber because no support column is required.

In an optional implementation, there is one second wick, and the second wick covers the first cover. Therefore, a cavity between the second wick and the second cover is a vapor cavity, and the second wick and the vapor cavity are a serial structure. There is one second wick, which can be made in an irregular shape to achieve better adaptation performance.

In an optional implementation, a support column is further disposed between the second cover and the second wick, and the support column is configured to support the second cover. Therefore, stability of the vapor chamber is improved.

In an optional implementation, the support column and the second cover are integrally formed. Therefore, a connection between the support column and the second cover is more stable.

In an optional implementation, the support column is a protrusion disposed on the second wick, and the support column and the second wick are integrally formed. Therefore, the support column can be configured to not only support the second cover, but also serve as a wick, a connection between the support column and the second wick is more stable, and when the support column uses a same structure as the wick, heat transfer performance of the vapor chamber can be improved.

In an optional implementation, a cross section of the support column is in a circular, rectangular, or irregular shape. Therefore, the support column can be made in a plurality of shapes.

In an optional implementation, a third wick is further disposed in the second cavity, and the third wick is connected to the first wick. Therefore, heat equalizing performance of the vapor chamber is further improved.

In an optional implementation, a material of the third wick is the same as materials of the first wick and the second wick. Therefore, product consistency is improved and a process is simpler.

In an optional implementation, the materials of the first wick and the second wick are copper, titanium, alloys, non-metal, or composite materials. Therefore, there are many choices for the materials of the first wick and the second wick, and process difficulty is relatively low.

In an optional implementation, the first wick and the second wick use a capillary structure, and a manner of forming the capillary structure includes at least one of the following: weaving, sintering, or etching. Therefore, a forming process of the first wick and the second wick is flexible, and a most appropriate process can be selected.

In an optional implementation, a cross-sectional shape of the first cavity is a rectangle. Therefore, the first cavity is in a regular shape with a uniform cross-sectional width, so that the first wicks can be evenly disposed at equal distances, to avoid obvious deterioration of thermal performance caused when a liquid working medium in a condensation zone cannot return due to a relatively large pressure difference between the first cavity and outside, or when a vapor cavity is blocked and vapor cannot return.

In an optional implementation, a cross-sectional shape of the second cavity is a regular polygon, a circle, or an irregular shape. Therefore, the second cavity may be in an irregular shape, to meet a heat dissipation requirement of a heat source in an irregular shape.

In an optional implementation, materials of the first cover and the second cover are metal, non-metal, or multi-layer composite materials. Therefore, material selection for the first cover and the second cover is more flexible, to achieve applicability to different products.

In an optional implementation, the cavity is further divided to obtain a third cavity. A third wick is disposed in the third cavity, and the third wick has one end connected to the first cover and the other end connected to the second cover; or the third wick is parallel to the first cover. The third wick is connected to the first wick and the second wick, and the third cavity communicates with the first cavity and the second cavity. Therefore, the vapor chamber has a more flexible structure, so that an internal structure of the wick can be flexibly adjusted based on a shape of a heat source of a product, thereby improving temperature equalizing performance of the vapor chamber.

According to a second aspect of this application, an electronic device is provided, including a heat source and the vapor chamber described above. Heat is conducted between the vapor chamber and the heat source. Therefore, with the foregoing structure, the vapor chamber has better heat equalizing performance, has a low cross-sectional height, and can be made in an irregular shape, to dissipate heat for an irregular heat source.

In an optional implementation, the electronic device further includes a housing, and heat is conducted between the vapor chamber and the housing. Therefore, the vapor chamber can be attached to the housing, to improve heat equalizing performance of the housing.

BRIEF DESCRIPTION OF DRAWINGS

FIG. 2b is an M-M cross-sectional view of the vapor chamber in FIG. 2a;

DESCRIPTION OF EMBODIMENTS

Figure 1:
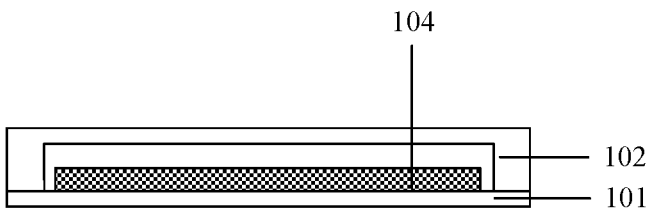
FIG. 1 is a schematic diagram of a structure of a vapor chamber.

To make the objectives, technical solutions, and advantages of this application clearer, the following further describes this application in detail with reference to the accompanying drawings.

The terms such as "first" and "second" mentioned below are merely intended for a purpose of description, and shall not be understood as an indication or implication of relative importance or implicit indication of the number of indicated technical features. Therefore, a feature limited by "first", "second" or the like may explicitly or implicitly include one or more features. In the descriptions of this application, unless otherwise stated, "a plurality of" means two or more than two.

In addition, in this application, orientation terms such as "upper" and "lower" are defined relative to orientations of components schematically placed in the accompanying drawings. It should be understood that these orientation terms are relative concepts, and are used for description and clarification of "relative", which may change correspondingly based on a change in a placement orientation of a component in the drawings.

Vapor chamber (VC): The vapor chamber is a vacuum cavity with a fine structure on an inner wall and injected with a working medium. A working principle of the vapor chamber is similar to that of a heat pipe, which specifically includes four main steps: conduction, evaporation, convection, and condensation. When heat generated by a heat source enters the vapor chamber through heat conduction, the working medium that is in the vapor chamber and that is close to a position of the heat source absorbs heat and then is vaporized quickly while taking away a large amount of heat. Then, with a latent heat property of vapor, when vapor in the vapor chamber diffuses from a high-pressure zone to a low-pressure zone (that is, a low temperature zone), when the vapor comes into contact with the inner wall at a lower temperature, the vapor is quickly condensed into a liquid state and releases thermal energy. The working medium condensed into the liquid state returns to the heat source under an action of a capillary force of the fine structure (capillary structure). So far, a heat conduction cycle is completed, and a two-way circulation system in which vapor and liquid of the working medium coexist is formed. At present, a common material of the vapor chamber is copper, and the working medium inside is pure water.

Capillary structure: Because a liquid surface of liquid has surface tension, when the liquid is infiltrated into a capillary hole, the liquid surface of the liquid is concave, so that the liquid surface exerts a pull force on the liquid below, causing the liquid to move upward along a wall of the capillary hole. This causes a capillary phenomenon. The capillary structure may include a plurality of capillary holes or a structure such as a fine groove similar to a capillary hole. Therefore, when a liquid working medium enters the capillary hole or the fine groove in the capillary structure, the liquid working medium flows to the other end of the capillary hole under a capillary action, thereby completing transfer and return of the working medium.

An embodiment of this application provides a vapor chamber. The vapor chamber may be applied to an electronic device, such as a mobile phone, a tablet computer, or a notebook computer, and a related module, structural member, functional member, or the like with a heat dissipation function. The electronic device includes a working module and a heat dissipation module, the heat dissipation module includes a vapor chamber, and the vapor chamber is configured to dissipate heat for the working module. Heat transfer performance and stability of the electronic device having the vapor chamber provided in this application are significantly improved, and requirements for lightweight, large-area, and large-span designs are met.

Figure 2A:
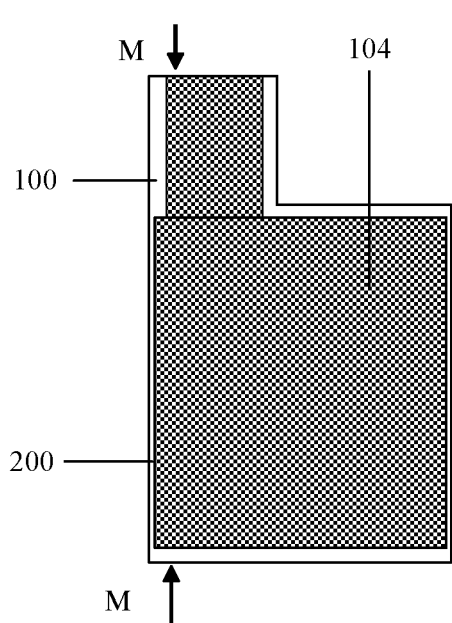
FIG. 2a is a schematic diagram of a structure of a vapor chamber according to an embodiment of this application.
Figure 2B:

FIG. 2a is a schematic diagram of a structure of a vapor chamber according to an embodiment of this application. FIG. 2b is an M-M cross-sectional view of the vapor chamber in FIG. 2a. As shown in FIG. 2a and FIG. 2b, the vapor chamber includes a first cover 101 close to a heat source, and a second cover 102 far from the heat source. The first cover 101 and the second cover 102 form a cavity.

The vapor chamber is, for example, special-shaped, and the cavity is divided into at least a first cavity 100 and a second cavity 200.

In this embodiment of this application, cross-sectional shapes of the first cavity 100 and the second cavity 200 are not limited. In some embodiments of this application, as shown in FIG. 2a and FIG. 2b, the cross-sectional shapes of the first cavity 100 and the second cavity 200 are rectangular, and the first cavity 100 and the second cavity 200 have different cross-sectional widths. The cross-sectional width of the second cavity 200 is greater than the cross-sectional width of the first cavity 100.

Therefore, the first cavity 100 is in a regular shape with a uniform cross-sectional width, so that first wicks can be evenly disposed at equal distances, to avoid obvious deterioration of thermal performance caused when a liquid working medium in a condensation zone cannot return due to a relatively large pressure difference between the first cavity and outside, or when a vapor cavity is blocked and vapor cannot return.

In some other embodiments of this application, the cross-sectional shape of the second cavity may alternatively be another regular polygon, a circle, or an irregular shape. Therefore, the second cavity may be in an irregular shape, to meet a heat dissipation requirement of a heat source in an irregular shape.

The vapor chamber further includes, for example, a second wick 104. The second wick 104 uses a capillary structure, the capillary structure is filled with, for example, a cooling medium, and the cooling medium may be, for example, deionized water, methanol, or acetone. Heat dissipation of the vapor chamber may be implemented through a vapor-liquid phase change of the working medium. A specific heat dissipation principle and heat dissipation path of the vapor chamber are described above.

The capillary structure may or may not be connected to an inner surface of a housing. The capillary structure is a porous medium whose material is metal. Specifically, the material of the capillary structure is copper or a copper alloy, and the capillary structure may be, for example, one or more of copper mesh, copper fiber, copper powder, or copper foam. Alternatively, titanium or other non-metal materials may be used. The copper mesh may be bonded to surfaces of the first cover 101 and the second cover 102 opposite to each other by sintering, hot welding, cold pressing, or the like, to fix the copper mesh on the inner surface of the housing by sintering, hot welding, cold pressing, or the like, to prevent a position of the copper mesh from changing during use, thereby ensuring stability of product working. Alternatively, the copper mesh may be placed in a sealed cavity without any connection processing, to avoid impact of sintering, hot welding, cold pressing, or other processing on the housing, thereby ensuring structural stability of the housing.

In some embodiments, the sealed cavity of the vapor chamber is provided with an opening communicating with outside. The opening may be a liquid injection port or a vacuum port. The cooling medium is injected into the sealed cavity through the opening, the sealed cavity is vacuumized through the opening, and then the opening is sealed, so that the sealed cavity is in a vacuum negative pressure state. When the sealed cavity is vacuumized inside, the injected cooling medium is in a negative pressure state, and once the cooling medium is heated in an evaporation zone, vaporization occurs. The vaporized cooling medium has a larger volume and fills the entire cavity. In a cooling zone, the cooling medium in a vapor state dissipates heat and is liquidized into a cooling medium in a liquid state, and the liquidized cooling medium returns to the evaporation zone via the capillary structure. In this way, a heat transfer cycle is formed in the sealed cavity.

A specific structure of the vapor chamber is not limited in this embodiment of this application. In some embodiments of this application, the second wick 104 and the vapor cavity use a serial structure.

The vapor chamber uses a serial structure and has a flexible shape. However, the structure is undiversified, and when the cross-sectional height is small, process difficulty in disposing the second wick 104 and the vapor cavity is increased.

Figure 3:
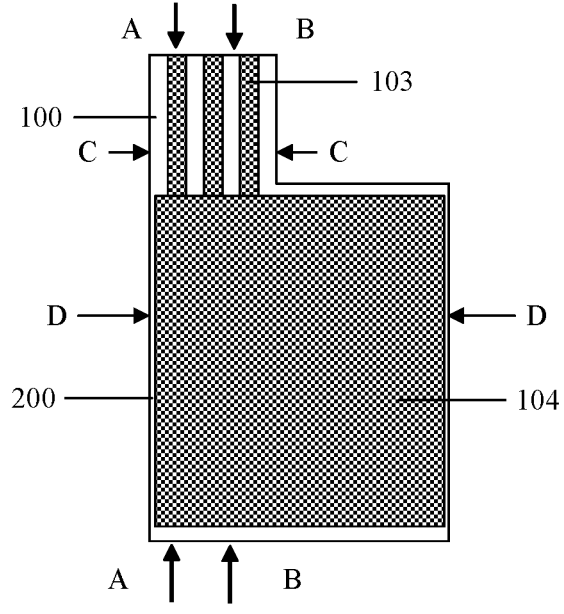
FIG. 3 is a schematic diagram of a structure of another vapor chamber according to an embodiment of this application.
Figure 3A:
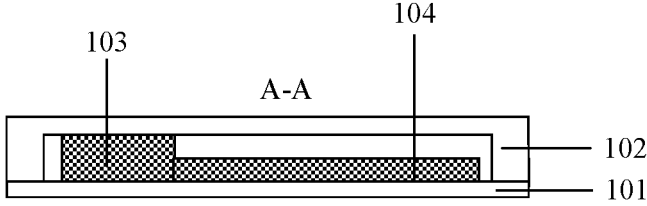
FIG. 3a is an A-A cross-sectional view of the vapor chamber in FIG. 3.
Figure 3B:
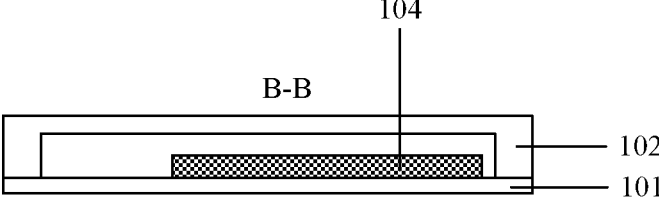
FIG. 3b is a B-B cross-sectional view of the vapor chamber in FIG. 3.
Figure 3C:
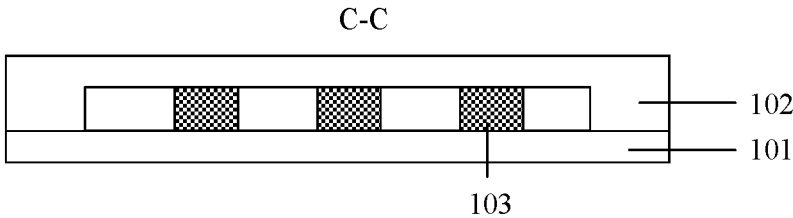
FIG. 3c is a C-C cross-sectional view of the vapor chamber in FIG. 3.
Figure 3D:
FIG. 3d is a D-D cross-sectional view of the vapor chamber in FIG. 3.

Therefore, an embodiment of this application further provides a vapor chamber. FIG. 3 is a schematic diagram of a structure of another vapor chamber according to an embodiment of this application. FIG. 3a is an A-A cross-sectional view of the vapor chamber in FIG. 3. FIG. 3b is a B-B cross-sectional view of the vapor chamber in FIG. 3. FIG. 3c is a C-C cross-sectional view of the vapor chamber in FIG. 3. FIG. 3d is a D-D cross-sectional view of the vapor chamber in FIG. 3. As shown in FIG. 3, FIG. 3a, FIG. 3b, FIG. 3c, and FIG. 3d, the vapor chamber includes a first cover 101 close to a heat source, and a second cover 102 far from the heat source. The first cover 101 and the second cover 102 form a cavity.

The vapor chamber is divided into at least a first cavity 100 and a second cavity 200. The first cavity 100 and the second cavity 200 have different cross-sectional sizes. It should be noted that different cross-sectional sizes may be different cross-sectional widths or different cross-sectional heights.

In some embodiments of this application, the first cavity 100 and the second cavity 200 have different cross-sectional widths. As shown in FIG. 3, the cross-sectional width of the first cavity 100 is greater than the cross-sectional width of the second cavity 200. Certainly, the cross-sectional width of the second cavity 200 may alternatively be greater than the cross-sectional width of the first cavity 100.

Figure 4:
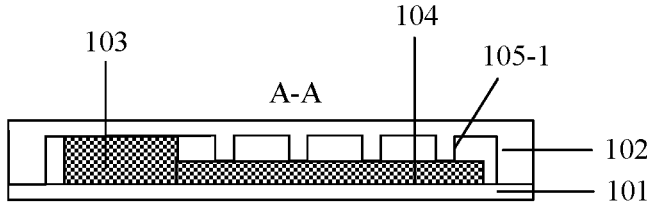
FIG. 4 is a schematic diagram of a structure of another vapor chamber according to an embodiment of this application.
Figure 4A:
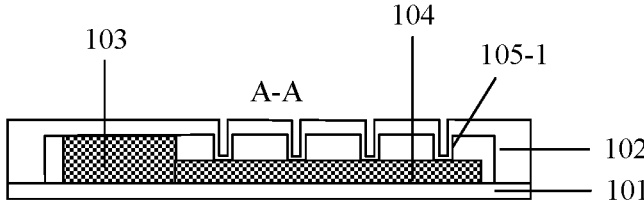
FIG. 4a is a schematic diagram of a structure of another vapor chamber according to an embodiment of this application.
Figure 4B:
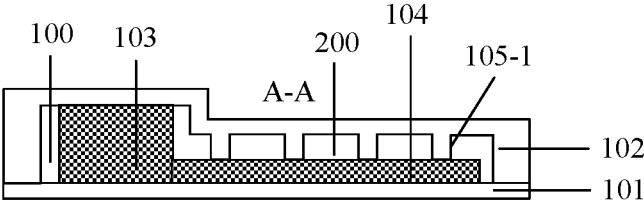
FIG. 4b is a schematic diagram of a structure of another vapor chamber according to an embodiment of this application.
Figure 4C:
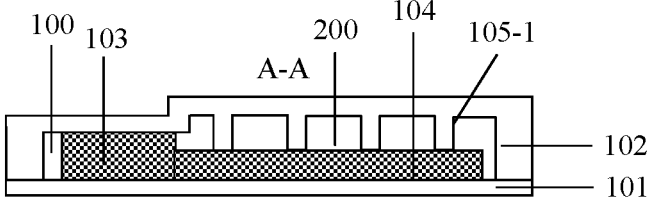
FIG. 4c is a schematic diagram of a structure of another vapor chamber according to an embodiment of this application.

In some other embodiments of this application, as shown in FIG. 4b, the first cavity 100 and the second cavity 200 have different cross-sectional heights. As shown in FIG. 4b, the cross-sectional height of the first cavity 100 is greater than the cross-sectional height of the second cavity 200. Certainly, as shown in FIG. 4c, the cross-sectional height of the second cavity 200 may alternatively be greater than the cross-sectional height of the first cavity 100. These all fall within the protection scope of this application.

As shown in FIG. 3c, a first wick 103 is disposed in the first cavity 100, and the first wick 103 has one end connected to the first cover 101 and the other end connected to the second cover 102.

There are a plurality of first wicks 103, the first wicks 103 are disposed in parallel, and the first cavity 100 is divided by the plurality of first wicks 103 into a plurality of first vapor cavities. The first wicks 103 and the first vapor cavities in the first cavity 100 use a parallel structure.

As shown in FIG. 3d, a second wick 104 is disposed in the second cavity 200, and the second wick 104 is parallel to the first cover 101.

One second wick 104 is disposed in the second cavity 200, the second wick 104 covers the first cover 101, and a cavity between the second wick 104 and the second cover forms a second vapor cavity. The second wick 104 and the second vapor cavity in the second cavity 200 use a serial structure.

As shown in FIG. 3, FIG. 3a, and FIG. 3b, the first wick 103 is connected to the second wick 104, and the first cavity 100 communicates with the second cavity 200.

During working, when heat generated by the heat source enters the vapor chamber through heat conduction, a working medium that is in the vapor chamber and that is close to a position of the heat source absorbs heat and then is vaporized quickly while taking away a large amount of heat. Then, with a latent heat property of vapor, when vapor in the vapor chamber diffuses from a high-pressure zone close to the first cover 101 to a low-pressure zone close to the second cover 102, and the vapor comes into contact with an inner wall of the second cover 102 at a lower temperature, the vapor is quickly condensed into a liquid state and releases thermal energy. The working medium condensed into the liquid state returns to the heat source under an action of a capillary force of the first wick 103 and the second wick 104. So far, a heat conduction cycle is completed, and a two-way circulation system in which vapor and liquid of the working medium coexist is formed.

In addition, because the first wick 103 is connected to the second wick 104, and the first cavity 100 communicates with the second cavity 200, vapor can flow in the first cavity 100 and the second cavity 200. In addition, when the liquid working medium in the first wick 103 or the second wick 104 decreases, liquid in the second wick 104 and the first wick 103 can be transferred to each other under the action of the capillary force, thereby further improving heat equalizing performance of the vapor chamber.

According to the vapor chamber provided in this embodiment of this application, the vapor chamber may be designed into an irregular shape based on a product structure design. A part uses a parallel structure, so that a structure is simple, heat dissipation efficiency is high, and a cross-sectional height is low. A part uses a serial structure, so that the vapor chamber of the serial structure may be made in an irregular shape. The vapor chamber uses a structure combining a serial structure and a parallel structure, which can support an irregular structure, and has better heat transfer performance while achieving thinning, thereby achieving thinning of the vapor chamber and improving heat transfer performance of an electronic device.

Figure 5:
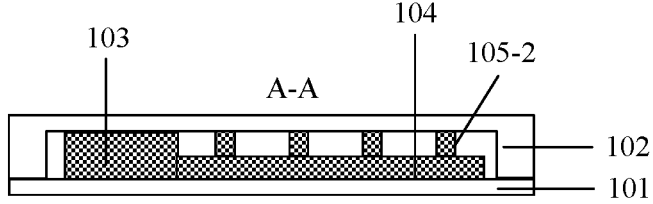
FIG. 5 is a schematic diagram of a structure of another vapor chamber according to an embodiment of this application.

In addition, as shown in FIG. 4, FIG. 4a, and FIG. 5, a support column (105-1 or 105-2) is further disposed between the second cover 102 and the second wick 104, and the support column (105-1 or 105-2) is configured to support the second cover 102. Therefore, with the support column disposed, strength of an internal wall structure is ensured, and stability of the vapor chamber is improved.

A structure of the support column is not limited in this application. In some embodiments of this application, as shown in FIG. 4, the support column 105-1 and the second cover 102 are integrally formed. Therefore, stability of a connection between the support column 105-1 and the second cover 102 is improved, and safety performance of the vapor chamber is improved.

In some other embodiments of this application, as shown in FIG. 4a, the support column 105-1 is formed through stamping of the second cover 102.

In some other embodiments of this application, as shown in FIG. 5, the support column 105-2 is a protrusion disposed on the second wick 104, and the support column 105-2 and the second wick 104 are integrally formed. Therefore, the support column 105-2 can be configured to not only support the second cover, but also serve as a wick, a connection between the support column 105-2 and the second wick is more stable, and when the support column 105-2 uses a same structure as the wick, heat equalizing performance of the vapor chamber can be improved.

A cross section of the support column is in a circular, rectangular, or irregular shape. Therefore, the support column is more flexibly designed.

Figure 6:
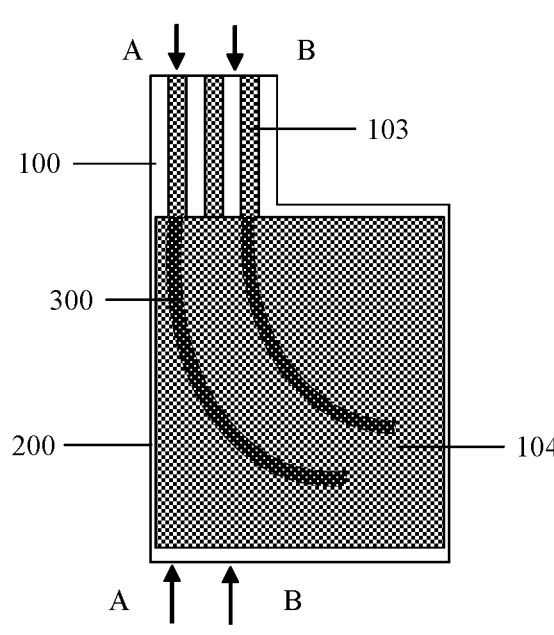
FIG. 6 is a schematic diagram of a structure of another vapor chamber according to an embodiment of this application.
Figure 6A:
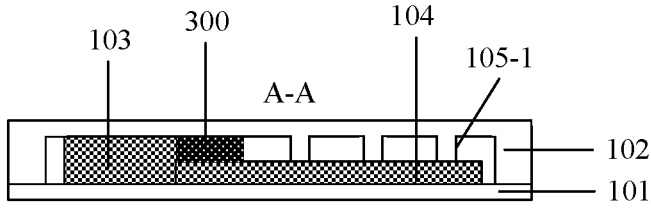
FIG. 6a is an A-A cross-sectional view of the vapor chamber in FIG. 6.
Figure 6B:
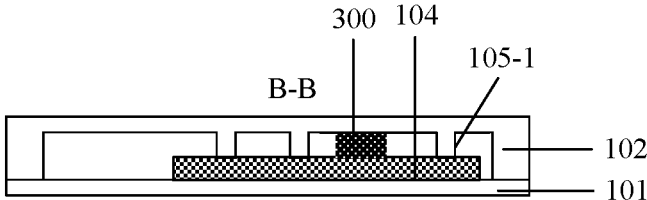
FIG. 6b is a B-B cross-sectional view of the vapor chamber in FIG. 6.

In some embodiments of this application, as shown in FIG. 6, FIG. 6a, and FIG. 6b, the vapor chamber includes a first cover 101 close to a heat source, and a second cover 102 far from the heat source. The first cover 101 and the second cover 102 form a cavity.

The vapor chamber is divided into at least a first cavity 100 and a second cavity 200, the first cavity 100 is disposed close to the heat source, and the first cavity 100 and the second cavity 200 have different cross-sectional widths.

As shown in FIG. 6a, a first wick 103 is disposed in the first cavity 100, and the first wick 103 has one end connected to the first cover 101 and the other end connected to the second cover 102.

There are a plurality of first wicks 103, the first wicks 103 are disposed in parallel, and the first cavity 100 is divided by the plurality of first wicks 103 into a plurality of first vapor cavities. The first wicks 103 and the first vapor cavities in the first cavity 100 use a parallel structure.

As shown in FIG. 6b, a second wick 104 is disposed in the second cavity 200, and the second wick 104 is parallel to the first cover 101.

One second wick 104 is disposed in the second cavity 200, the second wick 104 covers the first cover 101, and a cavity between the second wick 104 and the second cover forms a second vapor cavity. The second wick 104 and the second vapor cavity in the second cavity 200 use a serial structure.

In an optional implementation, a third wick 300 is further disposed in the second cavity 200, and the third wick 300 is connected to the first wick 103. Therefore, the third wick 300 may be connected to the first wick 103 and the second wick 104, so that heat in the first cavity can be better transferred to the second cavity, thereby further improving heat equalizing performance of the vapor chamber.

The third wick 300 may have a same structure as the first wick 103 and the second wick 104. The third wick 300 may use a powder strip, a powder wall, or a woven structure. Therefore, product consistency is improved and a manufacturing process is simplified.

In this embodiment of this application, materials of the wicks are not limited. The materials of the first wick 103 and the second wick 104 are, for example, copper, titanium, alloys, non-metal, or composite materials. Therefore, there are many choices for the materials of the first wick and the second wick, and process difficulty is relatively low.

The first wick 103 and the second wick 104 use a capillary structure, and a manner of forming the capillary structure includes at least one of the following: weaving, sintering, or grooving. Therefore, a forming process of the first wick and the second wick is flexible, and a most appropriate process can be selected.

For example, the capillary structure may include particles such as copper powder/nickel powder/titanium powder, which may be sintered on the first cover 101 by sintering/electroplating/spraying/glue dispensing. Certainly, alternatively, the whole may be sintered and then copper powder/nickel powder/titanium powder is removed by secondary processing.

A thickness of the vapor chamber is, for example, less than or equal to 0.3 mm. The first cover 101 and the second cover 102 may be manufactured by etching, stamping, or the like.

Figure 7:
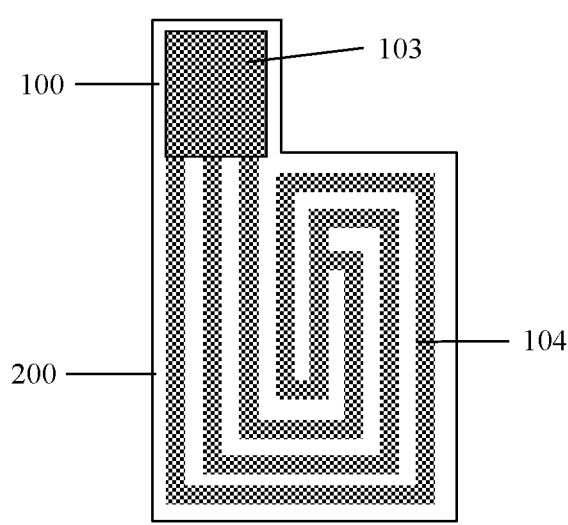
FIG. 7 is a schematic diagram of a structure of another vapor chamber according to an embodiment of this application.

In the foregoing embodiment, the cross-sectional width of the first cavity 100 is less than the cross-sectional width of the second cavity 200, the first wicks 103 use a parallel structure, and the second wick 104 uses a serial structure. In some other embodiments of this application, as shown in FIG. 7, the cross-sectional width of the first cavity 100 is less than the cross-sectional width of the second cavity 200, the first wick 103 uses a serial structure, and the second wick 104 uses a parallel structure.

Figure 8:
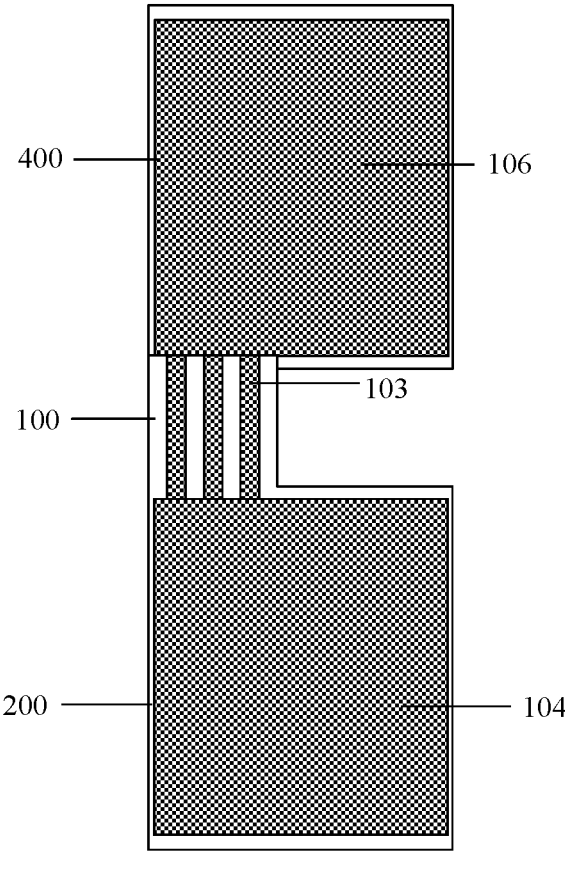
FIG. 8 is a schematic diagram of a structure of another vapor chamber according to an embodiment of this application.

In addition, the vapor chamber may be divided into more than two cavities. As shown in FIG. 8, the vapor chamber includes a first cover 101 close to a heat source, and a second cover 102 far from the heat source. The first cover 101 and the second cover 102 form a cavity.

The vapor chamber is divided into at least a first cavity 100, a second cavity 200, and a third cavity 400.

As shown in FIG. 8, a first wick 103 is disposed in the first cavity 100, and the first wick 103 has one end connected to the first cover 101 and the other end connected to the second cover 102.

There are a plurality of first wicks 103, the first wicks 103 are disposed in parallel, and the first cavity 100 is divided by the plurality of first wicks 103 into a plurality of first vapor cavities. The first wicks 103 and the first vapor cavities in the first cavity 100 use a parallel structure.

A second wick 104 is disposed in the second cavity 200, and the second wick 104 is parallel to the first cover 101.

One second wick 104 is disposed in the second cavity 200, the second wick 104 covers the first cover 101, and a cavity between the second wick 104 and the second cover forms a second vapor cavity. The second wick 104 and the second vapor cavity in the second cavity 200 use a serial structure.

A third wick 106 is disposed in the third cavity 400, and the third wick 106 has a same structure as the second wick 104. The third wick is connected to the first wick and the second wick, and the third cavity communicates with the first cavity and the second cavity.

Certainly, in some other embodiments of this application, the third wick may use a parallel structure. These all fall within the protection scope of this application.

Therefore, in this embodiment of this application, the vapor chamber is divided into a plurality of parts, and includes at least two types of internal structures, so that the vapor chamber has a more flexible structure, and an internal structure of the wick can be flexibly adjusted based on a shape of a heat source of a product, thereby improving temperature equalizing performance of the vapor chamber.

An embodiment of this application further provides an electronic device, including a beat source and the vapor chamber described above. Heat is conducted between the vapor chamber and the heat source. Therefore, with the foregoing structure, the vapor chamber has better heat equalizing performance, has a low cross-sectional height, and can be made in an irregular shape, to dissipate heat for an irregular heat source.

In some embodiments of this application, the electronic device further includes a housing, and heat is conducted between the vapor chamber and the housing. Therefore, the vapor chamber can be attached to the housing, to improve heat equalizing performance of the housing.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. An electronic device comprising:
   a heat source and a vapor chamber, wherein heat is conducted between the vapor chamber and the heat source,
       wherein the vapor chamber comprises a first cover close to the heat source, and a second cover away from the heat source,
       wherein the first cover and the second cover form a cavity, the cavity is divided into at least a first cavity and a second cavity, and
       wherein the first cavity and the second cavity have different cross-sectional sizes; and

a plurality of first wicks disposed in the first cavity, wherein the plurality of first wicks divide the first cavity into a plurality of parallel vapor cavities, wherein each of the plurality of first wicks has one end connected to the first cover and the other end connected to the second cover, wherein a second wick is disposed in the second cavity, and the second wick is parallel to the first cover, wherein each of the plurality of first wicks is connected to the second wick, and wherein the first cavity communicates with the second cavity.

2. The electronic device according to claim 1, wherein the first cavity and the second cavity have different cross-sectional heights.

3. The electronic device according to claim 1, wherein the first cavity and the second cavity have different cross-sectional widths.

4. The electronic device according to claim 1, wherein the second wick is a single wick, and the second wick covers the first cover.

5. The electronic device according to claim 1, wherein a support column is further disposed between the second cover and the second wick, and the support column is configured to support the second cover.

6. The electronic device according to claim 5, wherein the support column and the second cover are integrally formed.

7. The electronic device according to claim 5, wherein the support column is a protrusion disposed on the second wick, and the support column and the second wick are integrally formed.

8. The electronic device according to claim 1, wherein the plurality of first wicks do not overlap with the second wick.

9. A vapor chamber comprising:

a first cover close to a heat source; and a second cover away from the heat source, wherein the first cover and the second cover form a cavity, the cavity is divided into at least a first cavity and a second cavity, wherein the first cavity and the second cavity have different cross-sectional sizes, wherein a plurality of first wicks is disposed in parallel in the first cavity, wherein the plurality of first wicks divide the first cavity into a plurality of parallel vapor cavities, wherein each of the plurality of first wicks has one end connected to the first cover and the other end connected to the second cover, wherein a second wick is disposed in the second cavity, and the second wick is parallel to the first cover, wherein each of the plurality of first wicks is connected to the second wick, and wherein the first cavity communicates with the second cavity.

10. The vapor chamber according to claim 9, wherein the first cavity and the second cavity have different cross-sectional heights.

11. The vapor chamber according to claim 9, wherein the first cavity and the second cavity have different cross-sectional widths.

12. The vapor chamber according to claim 9, wherein the second wick is a single wick, and the second wick covers the first cover.

13. The vapor chamber according to claim 9, wherein a support column is further disposed between the second cover and the second wick, and the support column is configured to support the second cover.

14. The vapor chamber according to claim 13, wherein the support column and the second cover are integrally formed.

15. The vapor chamber according to claim 13, wherein the support column is a protrusion disposed on the second wick, and the support column and the second wick are integrally formed.

16. The vapor chamber according to claim 13, wherein a cross section of the support column is in a circular, rectangular, or irregular shape.

17. The vapor chamber according to claim 9, wherein a third wick is further disposed in the second cavity, and the third wick is connected to the plurality of first wicks.

18. The vapor chamber according to claim 17, wherein a material of the third wick is the same as materials of the plurality of first wicks and the second wick.

19. The vapor chamber according to claim 18, wherein the materials of the plurality of first wicks and the second wick are copper, titanium, alloys, non-metal, or composite materials.

20. The vapor chamber according to claim 9, wherein the plurality of first wicks and the second wick adopt a capillary structure, and a manner of forming the capillary structure comprises at least one of the following: weaving, sintering, or etching.

21. The vapor chamber according to claim 9, wherein a cross-sectional shape of the first cavity is a rectangle.

22. The vapor chamber according to claim 9, wherein a cross-sectional shape of the second cavity is a regular polygon, a circle, or an irregular shape.

23. The vapor chamber according to claim 9, wherein materials of the first cover and the second cover are metal, non-metal, or multi-layer composite materials.

24. The vapor chamber according to claim 9, wherein the cavity is further divided to obtain a third cavity, wherein a third wick is disposed in the third cavity;

wherein the third wick has one end connected to the first cover and the other end connected to the second cover, or the third wick is parallel to the first cover; and wherein the third wick is connected to the plurality of first wicks and the second wick, and the third cavity communicates with the first cavity and the second cavity.

25. The vapor chamber according to claim 9, wherein the plurality of first wicks do not overlap with the second wick.

\* \* \* \* \*